US012787208B2

(12) United States Patent
Yin et al.

(10) Patent No.: US 12,787,208 B2
(45) Date of Patent: Nov. 3, 2026

(54) THREADING STRUCTURE AND SERVER

(71) Applicant: SUZHOU METABRAIN INTELLIGENT TECHNOLOGY CO., LTD., Suzhou (CN)

(72) Inventors: Xiuzhong Yin, Suzhou (CN); Jingxian Zhu, Suzhou (CN); Zhencai Cao, Suzhou (CN); Zhanyang Li, Suzhou (CN)

(73) Assignee: SUZHOU METABRAIN INTELLIGENT TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 18/874,579

(22) PCT Filed: Sep. 15, 2023

(86) PCT No.: PCT/CN2023/118968
§ 371 (c)(1),
(2) Date: Dec. 12, 2024

(87) PCT Pub. No.: WO2024/156182
PCT Pub. Date: Aug. 2, 2024

(65) Prior Publication Data

US 2025/0380376 A1 Dec. 11, 2025

(30) Foreign Application Priority Data

Jan. 28, 2023 (CN) ......................... 202310042971.1

(51) Int. Cl.
*H05K 7/14* (2006.01)

(52) U.S. Cl.
CPC .................................. *H05K 7/1491* (2013.01)

(58) Field of Classification Search
CPC .......................... H05K 7/1491; G06F 2113/16
See application file for complete search history.

(56) References Cited

U.S. PATENT DOCUMENTS 6,646,893 B1 * 11/2003 Hardt .................. H05K 7/1491 361/752
6,972,949 B1 * 12/2005 Helgenberg ............ G06F 1/183 361/679.02

(Continued)

FOREIGN PATENT DOCUMENTS

CN 207437933 U 6/2018
CN 207459036 U 6/2018

(Continued)

OTHER PUBLICATIONS

EP23918183.7 extended European search report dated Apr. 29, 2025.

(Continued)

*Primary Examiner* — Nidhi Thaker
(74) *Attorney, Agent, or Firm* — IPro, PLLC

(57) ABSTRACT

A threading device and a server, which relates to the technical field of cable threading. The threading device includes: a tray (100), wherein the tray (100) is for being installed inside a server crate, and located over a PCIE module layer (700), the tray (100) is provided with a wiring hole, and the wiring hole is for the penetration by a cable; and a cable temporarily-storing member (200) provided at the tray (100), wherein the cable temporarily-storing member (200) is for fixing the cable that has passed through the wiring hole. In the threading device, by providing the tray (100), and providing the wiring hole and the cable temporarily-storing member (200) on the tray (100), the cable of the PCIE module layer (700) may be caused to pass through the wiring hole, subsequently be fixed by the cable temporarily-storing member (200), and subsequently be connected to the computation layer (600).

17 Claims, 6 Drawing Sheets

(56) References Cited

U.S. PATENT DOCUMENTS

| | | | | |
|---|---|---|---|---|
| 9,689,510 | B1 * | 6/2017 | Chang | H05K 7/18 |
| 11,369,044 | B2 * | 6/2022 | Tsorng | H05K 7/1491 |
| 12,010,811 | B1 * | 6/2024 | Chen | H05K 7/1491 |
| 12,328,837 | B2 * | 6/2025 | Zhu | G06F 1/183 |
| 2007/0217139 | A1 * | 9/2007 | Lin | G06F 1/20 312/223.1 |
| 2007/0258212 | A1 * | 11/2007 | Malone | H05K 7/20545 361/699 |
| 2013/0321997 | A1 * | 12/2013 | Yi | G06F 1/183 361/679.02 |
| 2013/0341471 | A1 * | 12/2013 | Yang | H05K 7/1491 248/65 |
| 2014/0183306 | A1 * | 7/2014 | Chen | H05K 7/1421 248/70 |
| 2015/0181748 | A1 * | 6/2015 | Bailey | G11B 33/128 361/679.02 |
| 2016/0309611 | A1 * | 10/2016 | Yi | H04Q 1/062 |
| 2016/0309612 | A1 * | 10/2016 | Yi | H05K 7/1491 |
| 2017/0118863 | A1 * | 4/2017 | Miwa | H02G 3/0406 |
| 2019/0166713 | A1 * | 5/2019 | Chen | H01R 12/7076 |
| 2020/0389993 | A1 * | 12/2020 | Wang | H05K 7/1487 |
| 2021/0120697 | A1 * | 4/2021 | Tsorng | H05K 7/1491 |
| 2021/0298192 | A1 * | 9/2021 | Peng | H05K 5/0247 |
| 2022/0159879 | A1 * | 5/2022 | Tsorng | H05K 7/20145 |

FOREIGN PATENT DOCUMENTS

| | | | |
|---|---|---|---|
| CN | 207881014 | U | 9/2018 |
| CN | 109340314 | A | 2/2019 |
| CN | 209560430 | U | 10/2019 |
| CN | 209824259 | U | 12/2019 |
| CN | 111356324 | A | 6/2020 |
| CN | 113359958 | A | 9/2021 |
| CN | 216772354 | U | 6/2022 |
| CN | 217656174 | U | 10/2022 |
| CN | 218240340 | U | 1/2023 |
| CN | 218386092 | U | 1/2023 |
| CN | 115776080 | A | 3/2023 |
| JP | 3220197 | U | 2/2019 |

OTHER PUBLICATIONS

KR10-2024-7043482 Request for the Submission of an Opinion dated Sep. 19, 2025.

* cited by examiner

THREADING STRUCTURE AND SERVER

CROSS-REFERENCE TO RELATED APPLICATION

The present application claims the priority of the Chinese patent application filed on Jan. 28, 2023 before the Chinese Patent Office with the application number of 20231004297.1 and the title of "THREADING STRUCTURE AND SERVER", which is incorporated herein in its entirety by reference.

FIELD

The present application relates to the technical field of cable threading, and particularly relates to a threading device and a server.

BACKGROUND

With the continuous expansion of the functions of servers, the structures of the servers are increasingly more complicated. When a server has multiple layers of nodes, there is a problem in the wiring of the cables that connect the computation node layer and the high-speed serial computer expansion-bus standard (Peripheral Component Interconnect Express, PCIE) module node layer. Currently, the wiring of the cables between the PCIE module node layer and the computation node layer is generally in two modes. The first type is wiring from the two sides of the mainboard to the rear end of the crate, and connecting to the PCIE module node layer by using an intelligent Contiguous Memory Allocation (CMA) technique. In such a mode, the cables are too long, which results in an unsatisfactory signal integrity (SI). The second type is that wiring holes are provided at the front and the rear of the mainboard, and the cables and the PCIE module node layer are directly interconnected via the wiring holes. Such a mode can ensure that the SI signal is satisfactory. However, in the threading, it is required that two persons lift the computation node layer, while another person performs the threading, which causes that the server assembling has high labor cost and time cost, which reduces the efficiency of the assembling of the server.

SUMMARY

The present application provides a threading device and a server.

According to the first aspect, the present application provides a threading device, wherein the threading device comprises:

- a tray, wherein the tray is for being installed inside a server crate, and located over a PCIE module layer, the tray is provided with a wiring hole, and the wiring hole is for penetration by a cable; and
- a cable temporarily-storing member provided at the tray, wherein the cable temporarily-storing member is for fixing the cable that has passed through the wiring hole.

In a threading device according to the present application, the cable temporarily-storing member comprises:

- a base provided on the tray; and
- a clamping mechanism connected to the base, wherein the clamping mechanism is openable and closable, and the clamping mechanism is for fixing the cable that has passed through the wiring hole.

In a threading device according to the present application, the clamping mechanism comprises:

- a connecting plate, wherein the connecting plate is connected to the base, the connecting plate has a first surface, a first end of the first surface is provided with a first boss, and the first boss is provided with a first clipping slot; and
- a first snap-fitting member, wherein a first end of the first snap-fitting member is rotatably connected to a second end of the first surface, a second end of the first snap-fitting member is provided with a first clipping hook, the first clipping hook is capable of being snap-fitted to the first clipping slot, and when the first clipping hook is snap-fitted to the first clipping slot, the first snap-fitting member and the connecting plate form a cable accommodating space therebetween.

In a threading device according to the present application, the connecting plate is rotatably connected to the base, and the connecting plate has a first position and a second position that are switchable;

- in response to the connecting plate being in the first position, the connecting plate and the tray are perpendicular, and the cable is located inside the cable accommodating space; and
- in response to the connecting plate being in the second position, the connecting plate and the tray are parallel, and the cable is located outside the cable accommodating space.

In a threading device according to the present application, the base comprises a first bottom plate and a side plate, the first bottom plate is provided on the tray, the side plate is perpendicular to the first bottom plate, and the side plate is provided with a first positioning member; and

- the connecting plate further has a second surface opposite to the first surface, the second surface is provided with a second positioning member, and in response to the connecting plate being in the first position, the second positioning member abuts the first positioning member.

In a threading device according to the present application, second clipping hooks are provided at two ends of the first bottom plate, and in response to the connecting plate being in the second position, the second clipping hooks are snap-fitted to the second surface of the connecting plate.

In a threading device according to the present application, the connecting plate is rotatably connected to the base by a rotation shaft.

In a threading device according to the present application, the connecting plate is flexibly connected to the base.

In a threading device according to the present application, the threading device further comprises a plurality of cable clamps, the cable clamps are provided at the tray, and the cable clamps are for fixing the cable.

In a threading device according to the present application, each of the cable clamps comprises:

- a second bottom plate provided on the tray;
- a second boss provided at a first end of the second bottom plate, wherein a surface of the second boss that is opposite to the second bottom plate is provided with a second clipping slot; and
- a second snap-fitting member, wherein the second snap-fitting member comprises a first snap-fitting part, a second snap-fitting part and a third clipping hook that are sequentially connected, the first snap-fitting part is perpendicular to the second bottom plate, and is connected to a second end of the second bottom plate, the second snap-fitting part is rotatably connected to the first snap-fitting part, and the third clipping hook is capable of being snap-fitted to the second clipping slot.

In a threading device according to the present application, the third clipping hook comprises:

a third snap-fitting part, wherein the third snap-fitting part and the second snap-fitting part are perpendicular and connected; and a fourth snap-fitting part, wherein the fourth snap-fitting part comprises a first main body and a second main body that are connected, an included angle between the first main body and the second main body is an obtuse angle, the first main body is elastically connected to the third snap-fitting part, and an included angle between the first main body and the third snap-fitting part is an acute angle; and when the third clipping hook is snap-fitted to the second clipping slot, the first main body and the third snap-fitting part are located inside the second clipping slot.

In a threading device according to the present application, the wiring hole is a plurality of wiring holes, and the plurality of wiring holes include a first wiring hole; and the plurality of cable clamps include a plurality of first cable clamps, the plurality of first cable clamps are arranged between the first wiring hole and the cable temporarily-storing member, and the first cable clamps and the cable temporarily-storing member are for fixing the cable that has passed through the first wiring hole.

In a threading device according to the present application, the plurality of wiring holes further include a second wiring hole, and the second wiring hole is located between the first wiring hole and the cable temporarily-storing member; and the plurality of cable clamps further include a plurality of second cable clamps, the plurality of second cable clamps are located on one side of the second wiring hole, and the second cable clamps are for fixing the cable that has passed through the second wiring hole.

In a threading device according to the present application, an end face of the tray is provided with a third wiring hole, the third wiring hole and the second cable clamps are located on the same one side of the second wiring hole, and the third wiring hole is for penetration by the cable that has passed through the second wiring hole.

In a threading device according to the present application, the threading device further comprises a sealing member, and the sealing member is for, after the cable has passed through the third wiring hole, sealing the third wiring hole.

In a threading device according to the present application, the tray comprises:

a third bottom plate, wherein the third bottom plate is provided with the wiring hole and the cable temporarily-storing member; and a border frame enclosing a periphery of the third bottom plate, wherein a plurality of connecting slots are provided at a side face of the border frame in a circumferential direction, and the connecting slots are for snap fitting to the server crate.

In a threading device according to the present application, each of the connecting slots comprises a first slot and a second slot that are connected, the first slot and the second slot are perpendicular, the first slot is provided in a height direction of the border frame, and the first slot extends throughout a bottom face of the border frame.

In a threading device according to the present application, a plurality of elastic pieces are provided at a top face of the border frame in a circumferential direction, and the elastic pieces are for abutting a computation layer.

According to the second aspect, the present application further provides a server, wherein the server comprises:

a server crate;

a PCIE module layer provided inside the server crate;

the threading device stated above, provided inside the server crate, and located over the PCIE module layer; and a computation layer, provided inside the server crate, and located over the threading device; and a first end of the cable is connected to the PCIE module layer, and a second end of the cable extends throughout the threading device and is connected to the computation layer.

In the threading device according to the present application, by providing the tray, and providing the wiring hole and the cable temporarily-storing member on the tray, the cable of the PCIE module layer may be caused to pass through the wiring hole, subsequently be fixed by the cable temporarily-storing member, and subsequently be connected to the computation layer. In the connecting process, the threading device and the computation layer are sequentially installed, which does not require simultaneous operation by multiple persons, thereby simplifying the process of the assembling of the server, increasing the efficiency of the assembling of the server, and reducing the labor cost and the time cost.

BRIEF DESCRIPTION OF THE DRAWINGS

In order to more clearly illustrate the technical solutions of the present application or the prior art, the figures that are required to describe the embodiments or the prior art will be briefly described below. Apparently, the figures that are described below are embodiments of the present application, and a person skilled in the art can obtain other figures according to these figures without paying creative work.

REFERENCE NUMBERS

Figure 1:
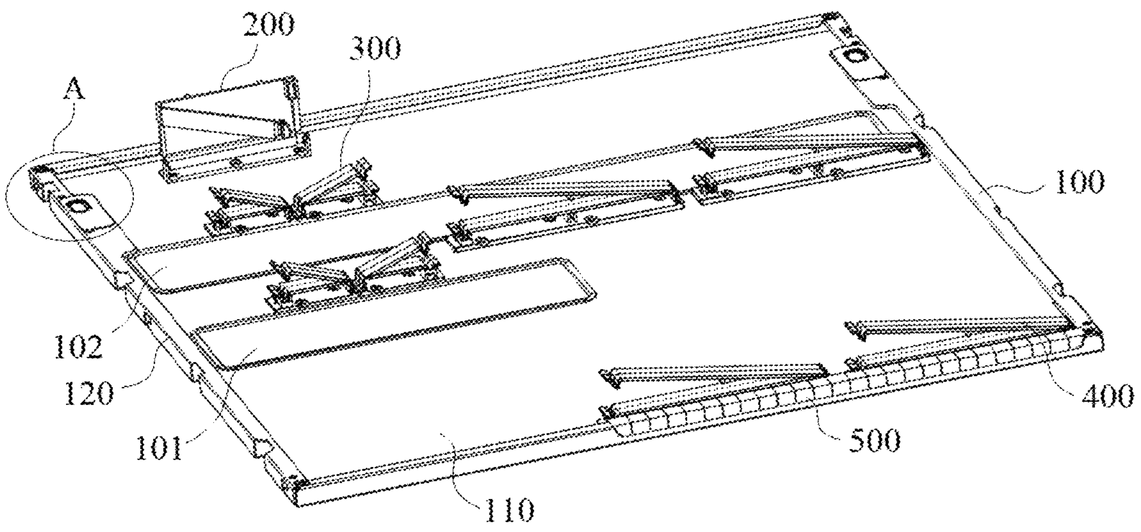
FIG. 1 is a schematic structural diagram of a threading device according to the present application.

100: tray; 101: first wiring hole; 102: second wiring hole; 110: third bottom plate; 120: border frame; 200: cable temporarily-storing member; 201: first bottom plate; 202: side plates; 203: first positioning member; 204: second clipping hooks; 211: connecting plate; 212: first boss; 213: first snap-fitting member; 214: second positioning member; 300: first cable clamps; 301: second bottom plate; 302: second boss; 303: second clipping slot; 311: first snap-fitting part; 312: second snap-fitting part; 313: third snap-fitting part; 314: fourth snap-fitting part; 400: second cable clamps; 500: sealing foam; 600: computation layer; 601: mainboard; 602: power board; 700: PCIE module layer; 1201: connecting slots; 1202: elastic pieces; 2121: first clipping slot; 2131: first clipping hook; 3141: first main body; and 3142: second main body.

DETAILED DESCRIPTION

In order to make the objects, the technical solutions and the advantages of the present application clearer, the technical solutions according to the present application will be clearly and completely described below with reference to the drawings according to the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

The features defined by the terms “first” and “second” in the description and the claims of the present application may explicitly or implicitly comprise one or more of the features. In the description of the present application, unless stated otherwise, the meaning of “plurality of” is “two or more”.

In the description of the present application, it should be understood that the terms that indicate orientation or position relations, such as “central”, “longitudinal”, “transverse”, “length”, “width”, “thickness”, “upper”, “lower”, “front”, “rear”, “left”, “right”, “vertical”, “horizontal”, “top”, “bottom”, “inner” and “outer”, are based on the orientation or position relations shown in the drawings, and are merely for conveniently describing the present application and simplifying the description, rather than indicating or implying that the device or element must have the specific orientation and be constructed and operated according to the specific orientation. Therefore, they should not be construed as a limitation on the present application.

In the description of the present application, it should also be noted that, unless explicitly defined or limited otherwise, the terms “provide”, “mount”, “connect” and “link” should be interpreted broadly. For example, it may be fixed connection, detachable connection, or integral connection; it may be mechanical connection or electrical connection; and it may be direct connection or indirect connection by an intermediate medium, and may be the internal communication between two elements. For a person skilled in the art, the particular meanings of the above terms in the present application may be comprehended according to particular situations.

The threading device and the server according to the present application will be described below with reference to FIGS. 1-9.

As shown in FIG. 1, in an embodiment of the present application, the threading device comprises a tray 100 and a cable temporarily-storing member 200. The tray 100 is for being installed inside a server crate, and located over a PCIE module layer 700, the tray 100 is provided with a wiring hole, and the wiring hole is for the penetration by a cable. The cable temporarily-storing member 200 is provided at the tray 100, and the cable temporarily-storing member 200 is for fixing the cable that has passed through the wiring hole.

Particularly, in the prior art, both of a computation layer 600 and the PCIE module layer 700 are provided inside the server crate, and the computation layer 600 is located over the PCIE module layer 700. The computation layer 600 is provided with the components such as a mainboard 601 and a power board 602. The PCIE module layer 700 is provided with a PCIE form card and a Riser card, wherein the Riser card is an expansion card. In the assembling of the server, it is required to connect the PCIE form card and the power board 602 by using a cable, and connect the Riser card and the mainboard 601 by using a cable.

In the present embodiment, firstly the PCIE module layer 700 is installed into the server crate, the cables that are connected to the PCIE form card and the Riser card are caused to pass through the wiring hole, and subsequently the threading device is installed into the server crate. The cables that have passed through the wiring hole pass through the cable temporarily-storing member 200, whereby the cable temporarily-storing member 200 may clamp the cables, subsequently the computation layer 600 is installed into the server crate, and finally the cables are connected to the power board 602 and the mainboard 601 of the computation layer 600.

In the threading device according to the embodiments of the present application, by providing the tray, and providing the wiring hole and the cable temporarily-storing member on the tray, the cable of the PCIE module layer may be caused to pass through the wiring hole, subsequently be fixed by the cable temporarily-storing member, and subsequently be connected to the computation layer. In the connecting process, the threading device and the computation layer are sequentially installed, which does not require simultaneous operation by multiple persons, thereby simplifying the process of the assembling of the server, increasing the efficiency of the assembling of the server, and reducing the labor cost and the time cost.

Figure 2:
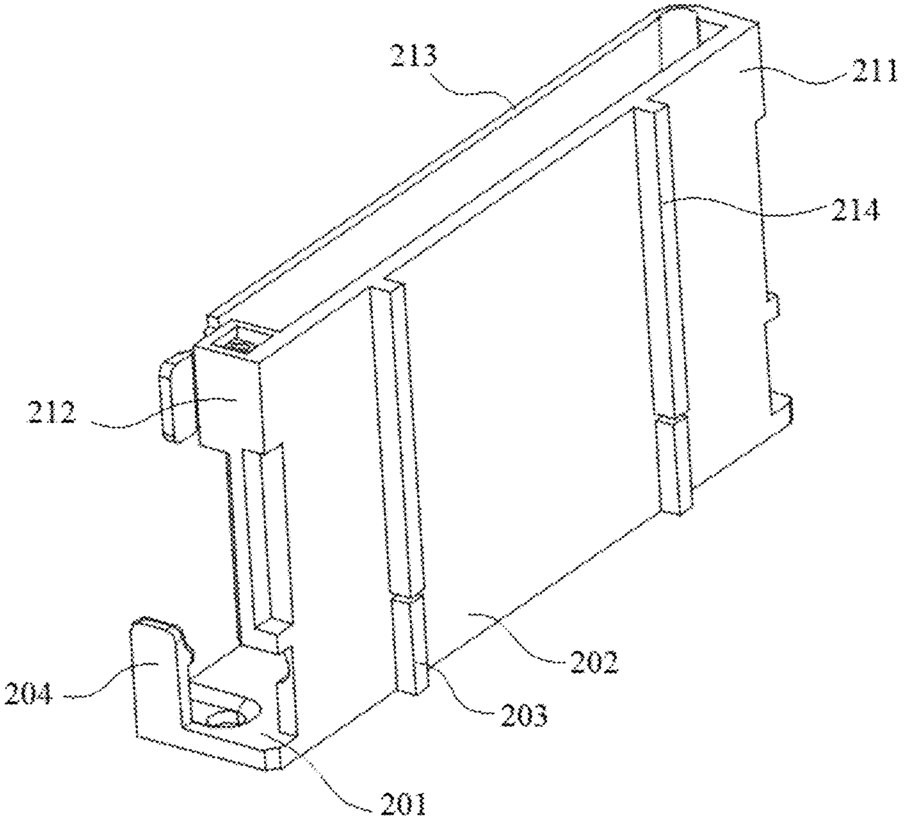
FIG. 2 is a schematic structural diagram of the cable temporarily-storing member shown in FIG. 1 in the first position.

As shown in FIG. 2, in an embodiment of the present application, the cable temporarily-storing member 200 comprises a base and a clamping mechanism. The base is provided at the tray 100, the clamping mechanism is connected to the base, the clamping mechanism is openable and closable, and the clamping mechanism is for fixing the cable that has passed through the wiring hole.

Particularly, the cable connected to the PCIE module layer 700, after passing through the wiring hole, penetrates the clamping mechanism, wherein the clamping mechanism is for fixing the cable, and, subsequently, after the computation layer 600 has been installed into the server crate, the cable is connected to the computation layer.

Figure 3:
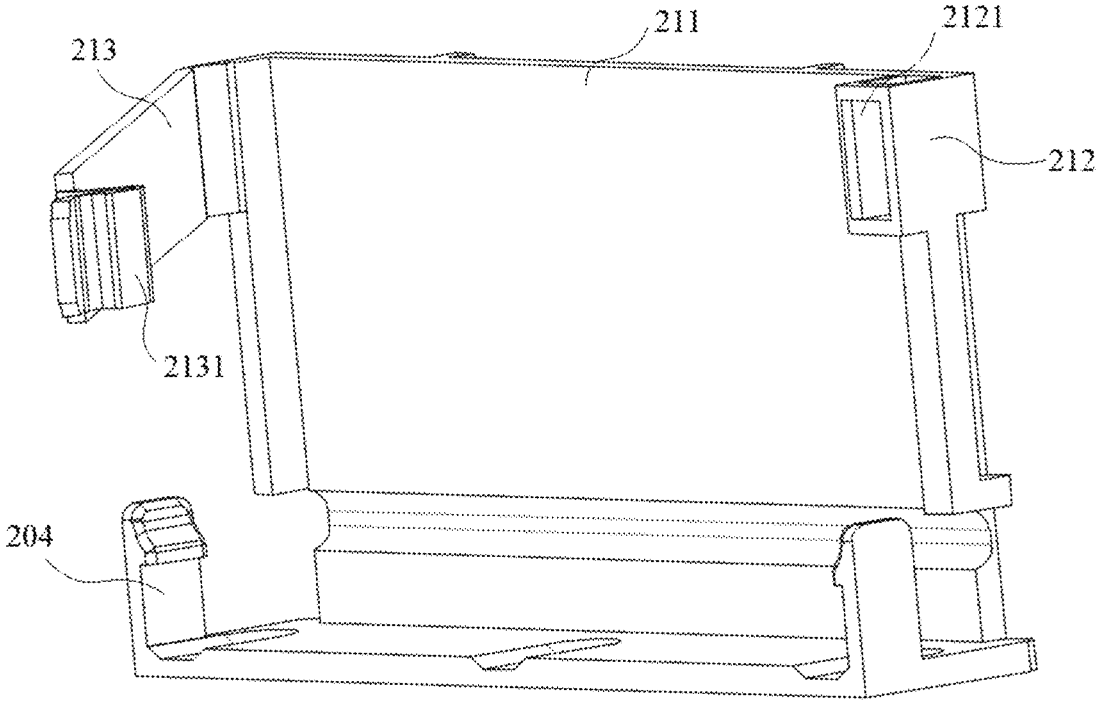
FIG. 3 is a schematic structural diagram of the cable temporarily-storing member shown in FIG. 1.

Optionally, as shown in FIG. 3, in an embodiment of the present application, the clamping mechanism comprises a connecting plate 211, a first boss 212 and a first snap-fitting member 213. The connecting plate 211 is connected to the base, the connecting plate 211 has a first surface, a first end of the first surface is provided with the first boss 212, and the first boss 212 is provided with a first clipping slot 2121. A first end of the first snap-fitting member 213 is rotatably connected to a second end of the first surface, a second end of the first snap-fitting member 213 is provided with a first clipping hook 2131, the first clipping hook 2131 is capable of being snap-fitted to the first clipping slot 1212, and when the first clipping hook 2131 is snap-fitted to the first clipping slot 2121, the first snap-fitting member 213 and the connecting plate 211 form a cable accommodating space therebetween.

Particularly, in the present embodiment, the first snap-fitting member 213 is capable of being snap-fitted to the first clipping slot 2121, to cause the clamping mechanism to be openable and closable. When the first snap-fitting member 213 is snap-fitted to the first clipping slot 2121, the space between the first snap-fitting member 213 and the connecting plate 211 forms the cable accommodating space. When the cable is being fixed, firstly the first snap-fitting member 213 and the first clipping slot 2121 are disengaged, the cable is straightened and subsequently adhered to the connecting plate 211, and subsequently the first snap-fitting member 213 is snap-fitted to the first clipping slot 2121, so as to fix the cable.

In the threading device according to the embodiments of the present application, by providing the clamping mechanism, the cable that has passed through the wiring hole may be fixed, and when the cable penetrates the clamping mechanism, the cable may be in the vertical state by using the tension of the cable and the clamping force of the clamping mechanism, which facilitates to, after the computation layer has been installed, connect the cable to the computation layer. By using the threading device according to the embodiments of the present application, one person may assemble the server crate, which increases the efficiency of the assembling of the server.

Figure 4:
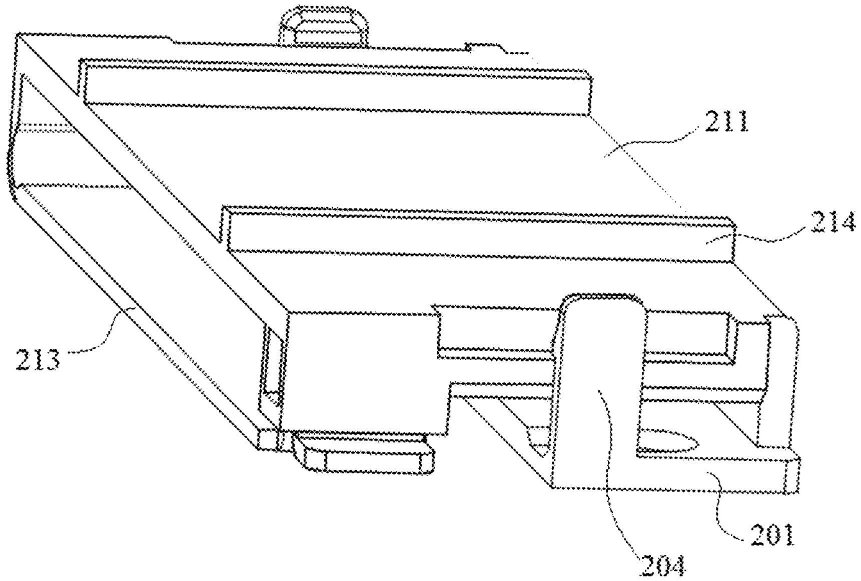
FIG. 4 is a schematic structural diagram of the cable temporarily-storing member shown in FIG. 1 in the second position.

As shown in FIGS. 2 and 4, in an embodiment of the present application, the connecting plate 211 is rotatably connected to the base, and the connecting plate 211 has a first position and a second position that are switchable. When the connecting plate 211 is in the first position, the connecting plate 211 and the tray 100 are perpendicular, and the cable is located inside the cable accommodating space. When the connecting plate 211 is in the second position, the connecting plate 211 and the tray 100 are parallel, and the cable is located outside the cable accommodating space.

Particularly, after the cable has passed through the wiring hole, it is required to fix the cable. The connecting plate 211 is in the first position; in other words, the connecting plate 211 is in a vertical position, and is perpendicular to the tray 100, whereby the cable that has passed through the cable accommodating space points upwardly. After the cable has been straightened, the cable is in the vertical state by using the tension of itself and the clamping force of the clamping mechanism. After the computation layer 600 has been installed, the first snap-fitting member 213 and the first clipping slot 2121 are disengaged, to release the cable, and the cable is connected to the computation layer 600. Subsequently, the connecting plate 211 is flipped, to cause it to be parallel to the tray 100; in other words, the connecting plate 211 is in a horizontal position, which is the second position of the connecting plate 211.

In the threading device according to the embodiments of the present application, by configuring the connecting plate to have the two positions, when the connecting plate is in the first position, it has a higher height, which may fix the cable. When the connecting plate is in the second position, it has a lower height, which may increase the spacing between the threading device and the computation layer, to facilitate the heat dissipation of the computation layer.

Optionally, in an embodiment of the present application, the connecting plate 211 may be rotatably connected to the base by a rotation shaft. In another embodiment of the present application, the connecting plate 211 may also be flexibly connected to the base. Particularly, the material of the connection between the connecting plate 211 and the base may be a flexible material such as silica gel, so that the connecting plate 211 is capable of rotating relative to the base.

As shown in FIG. 2, in an embodiment of the present application, the base comprises a first bottom plate 201 and a side plate 202. The first bottom plate 201 is provided on the tray 100, the side plate 202 is perpendicular to the first bottom plate 201, and the side plate 202 is provided with a first positioning member 203. The connecting plate 211 further has a second surface opposite to the first surface, the second surface is provided with a second positioning member 214, and when the connecting plate 211 is in the first position, the second positioning member 214 abuts the first positioning member 203.

Particularly, the first positioning member 203 and the second positioning member 214 are for positioning the rotation angle of the connecting plate 211. When the connecting plate 211 has rotated to the first position from the second position, or, in other words, when the connecting plate 211 has flipped to the vertical state from the horizontal state, the second positioning member 214 exactly abuts the first positioning member 203, which may prevent the connecting plate 211 from excessively flipping, to ensure that the connecting plate 211 is perpendicular to the first bottom plate 201.

In the threading device according to the embodiments of the present application, by providing the first positioning member at the base, and providing the second positioning member at the connecting plate, when the connecting plate has flipped to the vertical state from the horizontal state, the second positioning member abuts the first positioning member, to serve for limiting, which prevents the connecting plate from excessively flipping, so as to ensure that the cable that has passed through the clamping mechanism is in the vertical state.

As shown in FIG. 4, in an embodiment of the present application, second clipping hooks 204 are provided at the two ends of the first bottom plate 201, and when the connecting plate 211 is in the second position, the second clipping hooks 204 are snap-fitted to the second surface of the connecting plate 211.

Particularly, slots are provided at the two ends of the second surface of the connecting plate 211, and when the connecting plate 211 is in the second position, the second clipping hooks 204 are snap-fitted to the slots, so as to cause the clamping mechanism and the base to be fixed to form an entirety.

As shown in FIG. 1, in an embodiment of the present application, the threading device further comprises a plurality of cable clamps, the cable clamps are provided at the tray 100, and the cable clamps are for fixing the cable.

Particularly, in an embodiment of the present application, the plurality of cable clamps include a plurality of first cable clamps 300 and a plurality of second cable clamps 400. The wiring hole is a plurality of wiring holes, and the plurality of wiring holes include a first wiring hole 101 and a second wiring hole 102.

Particularly, the plurality of first cable clamps 300 are arranged between the first wiring hole 101 and the cable temporarily-storing member 200, and the first cable clamps 300 and the cable temporarily-storing member 200 are for fixing the cable that has passed through the first wiring hole 101.

Particularly, the cable connected to the Riser card sequentially passes through the first wiring hole 101 and the plurality of first cable clamps 300, and subsequently penetrates the clamping mechanism of the cable temporarily-storing member 200, and the clamping mechanism fixes the cable. After the operator has straightened the cable, the cable is in the vertical state by using the tension of itself and the clamping force of the clamping mechanism. After the computation layer 600 has been installed, the first snap-fitting member 213 and the first clipping slot 2121 of the clamping mechanism are disengaged, to release the cable, the cable is connected to the computation layer 600, and subsequently the connecting plate 211 is flipped by 90°, to cause the connecting plate 211 to be parallel to the tray 100.

Optionally, in the present embodiment, between the first wiring hole 101 and the cable temporarily-storing member 200, in the direction of extension of the cable, a plurality of first cable clamps 300 may be provided to fix the direction of extension of the cable.

The second wiring hole 102 is located between the first wiring hole 101 and the cable temporarily-storing member 200, the plurality of second cable clamps 400 are located on one side of the second wiring hole 102, and the second cable clamps 400 are for fixing the cable that has passed through the second wiring hole 102.

Particularly, the cable connected to the PCIE form card passes through the second wiring hole 102, subsequently passes through the second cable clamps 400, and is connected to the power board 602 of the computation layer 600. In an embodiment, in the direction of wiring of the cable there may be a plurality of second cable clamps 400, to fix the direction of extension of the cable.

Further, in the above embodiments, both of the first wiring hole 101 and the second wiring hole 102 are rectangular holes, and have large sizes, so that a plurality of cables may pass through the first wiring hole 101 and the second wiring hole 102 at the same time. Moreover, the large sizes may facilitate the plurality of cables to be arranged side by side, which improves the aesthetic degree of the cables wiring. In the embodiment shown in FIG. 1, the length of the second wiring hole 102 is greater than the length of the first wiring hole 101. In an embodiment, the length of the second wiring hole 102 may also be equal to the length of the first wiring hole 101, or less than the length of the first wiring hole 101, as long as it is satisfied that the first wiring hole 101 and the second wiring hole are arranged in stagger, to facilitate the cable connected to the PCIE form card to be connected to the mainboard 601.

Figure 5:
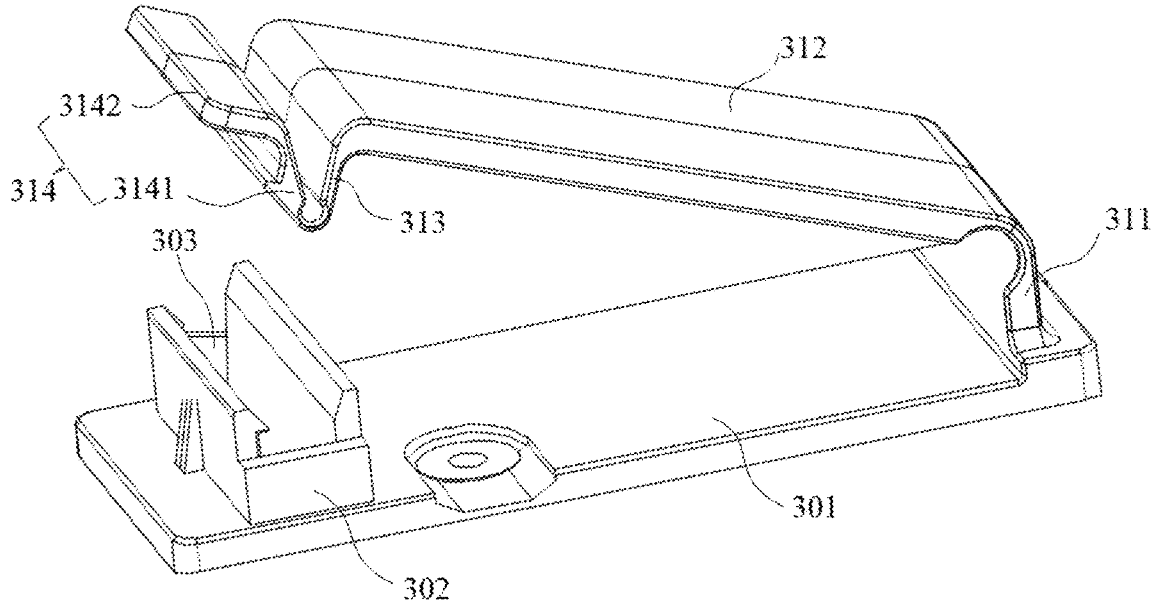
FIG. 5 is a schematic structural diagram when the first cable clamps shown in FIG. 1 are opened.
Figure 6:
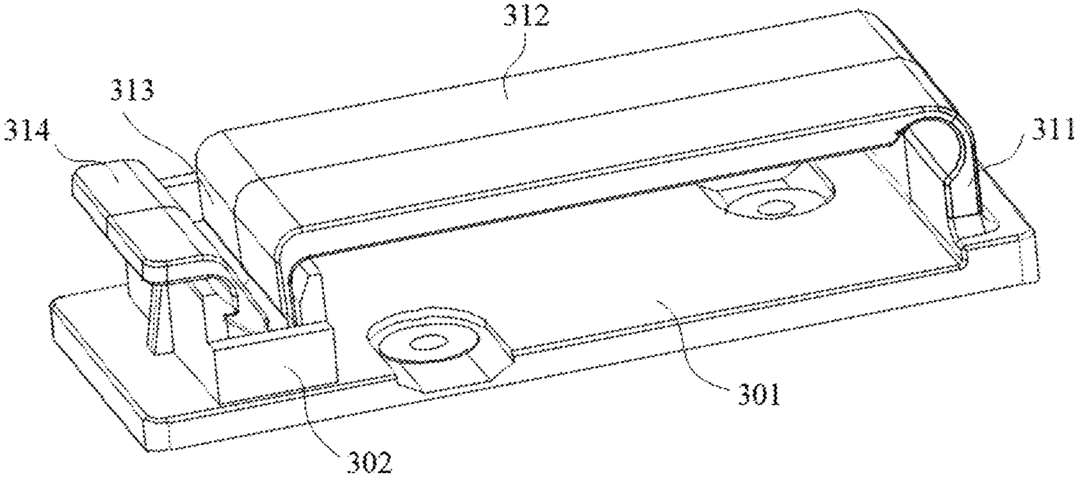
FIG. 6 is a schematic structural diagram when the first cable clamps shown in FIG. 1 are closed.

As shown in FIGS. 5 and 6, in an embodiment of the present application, the structures of the first cable clamp 300 and the second cable clamp 400 are the same. The particular structures of the first cable clamp 300 and the second cable clamp 400 will be described in detail below by taking the first cable clamp 300 as an example.

The first cable clamp 300 comprises a second bottom plate 301, a second boss 302 and a second snap-fitting member. The second bottom plate 301 is provided on the tray 100, the second boss 302 is provided at a first end of the second bottom plate 301, and the surface of the second boss 302 that is opposite to the second bottom plate 301 is provided with a second clipping slot 303. The second snap-fitting member comprises a first snap-fitting part 311, a second snap-fitting part 312 and a third clipping hook that are sequentially connected, the first snap-fitting part 311 is perpendicular to the second bottom plate 301, and is connected to a second end of the second bottom plate 301, the second snap-fitting part 312 is rotatably connected to the first snap-fitting part 311, and the third clipping hook is capable of being snap-fitted to the second clipping slot 303.

In an embodiment, the third clipping hook comprises a third snap-fitting part 313 and a fourth snap-fitting part 314. The third snap-fitting part 313 and the second snap-fitting part 312 are perpendicular and connected, the fourth snap-fitting part 314 comprises a first main body 3141 and a second main body 3142 that are connected, the included angle between the first main body 3141 and the second main body 3142 is an obtuse angle, the first main body 3141 is elastically connected to the third snap-fitting part 313, and the included angle between the first main body 3141 and the third snap-fitting part 313 is an acute angle. When the third clipping hook is snap-fitted to the second clipping slot 303, the first main body 3141 and the third snap-fitting part 313 are located inside the second clipping slot 303.

Particularly, the second snap-fitting part 312 and the first snap-fitting part 311 of the second snap-fitting member are rotatably connected, so that the second snap-fitting part 312 is capable of driving the third clipping hook to move in the direction of approaching the second clipping slot 303 or leaving the second clipping slot 303. While the third clipping hook is entering the second clipping slot 303, the included angle between the first main body 3141 of the fourth snap-fitting part 314 and the third snap-fitting part 313 is reduced, and the first main body 3141 and the third snap-fitting part 313 enter the second clipping slot 303. After they have entered, the included angle between the first main body 3141 and the third snap-fitting part 313 recovers to the original angle, so that the second main body 3142 of the fourth snap-fitting part 314 abuts the surface of the second clipping slot 303. When it is required to disengage the third clipping hook from the second clipping slot 303, the second main body 3142 is pulled, to cause the included angle between the first main body 3141 and the third snap-fitting part 313 to be reduced, whereby the first main body 3141 and the third snap-fitting part 313 are disengaged from the second clipping slot 303.

It should be noted that, in an embodiment of the present application, the particular structure of the first snap-fitting member 213 may also be the same as the particular structure of the second snap-fitting member.

In an embodiment of the present application, the end face of the tray 100 is provided with a third wiring hole, the third wiring hole and the second cable clamps 400 are located on the same one side of the second wiring hole 102, and the third wiring hole is for the penetration by the cable that has passed through the second wiring hole 102.

Particularly, in the present embodiment, the third wiring hole is provided at the end face of the tray 100, the cable connected to the PCIE form card passes through the second wiring hole 102, subsequently passes through the second cable clamps 400 and the third wiring hole, and is connected to the power board 602 of the computation layer 600.

As shown in FIG. 1, in an embodiment of the present application, the threading device further comprises a sealing member 500, and the sealing member 500 is for, after the cable has passed through the third wiring hole, sealing the third wiring hole.

Particularly, by providing the sealing member 500 at the third wiring hole, the gap between the third wiring hole and the cable may be sealed, thereby preventing the hot air inside the server crate from flowing back. Optionally, in an embodiment of the present application, the sealing member 500 may be a foam.

Figure 7:
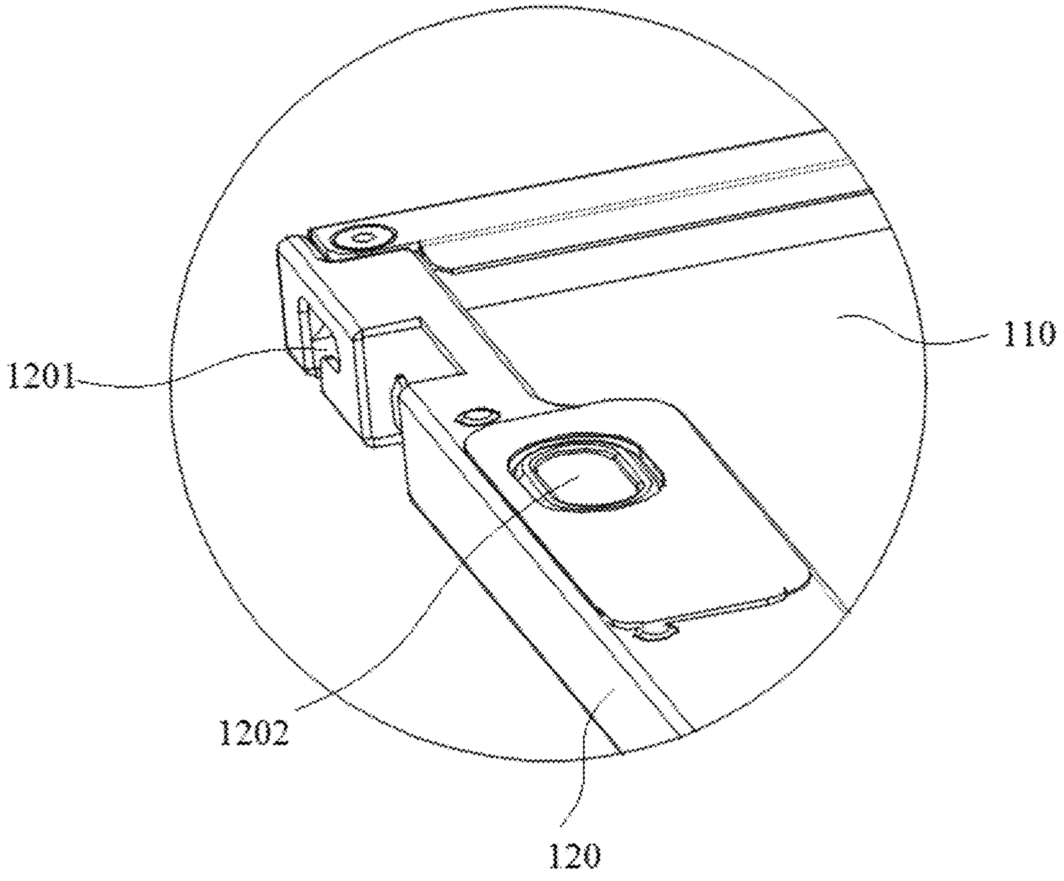
FIG. 7 is a partially enlarged view of the position A in FIG. 1.

As shown in FIG. 7, in an embodiment of the present application, the tray 100 comprises a third bottom plate 110 and a border frame 120. The third bottom plate 110 is provided with the wiring hole and the cable temporarily-storing member 200, the border frame 120 encloses the periphery of the third bottom plate 110, a plurality of connecting slots 1201 are provided at the side face of the border frame 120 in the circumferential direction, and the connecting slots 1201 are for the snap fitting to the server crate.

Particularly, the plurality of connecting slots 1201 are provided at the periphery of the border frame 120. When the threading device is being installed into the server crate, the inner wall of the server crate is provided with a plurality of plugs, and each of the plugs is inserted into one of the connecting slots 1201, whereby the threading device is snap-fitted to the server crate, thereby realizing tool-free installation of the threading device.

Optionally, in an embodiment of the present application, each of the connecting slots 1201 comprises a first slot and a second slot that are connected, the first slot and the second slot are perpendicular, the first slot is provided in the height direction of the border frame 120, and the first slot extends throughout the bottom face of the border frame 120.

Particularly, in the installation, firstly the first slot is slid along the plug, subsequently the second slot is slid along the plug, whereby the plug is located inside the second slot, and the border frame 120 is lifted, thereby realizing tool-free installation of the threading device.

As shown in FIG. 7, in an embodiment of the present application, a plurality of elastic pieces 1202 are provided at the top face of the border frame 120 in the circumferential direction, and the elastic pieces 1202 are for abutting the computation layer 600.

Particularly, after the threading device has been installed into the server crate, the elastic pieces 1202 abut the computation layer 600, to serve to support the computation layer 600.

Figure 8:
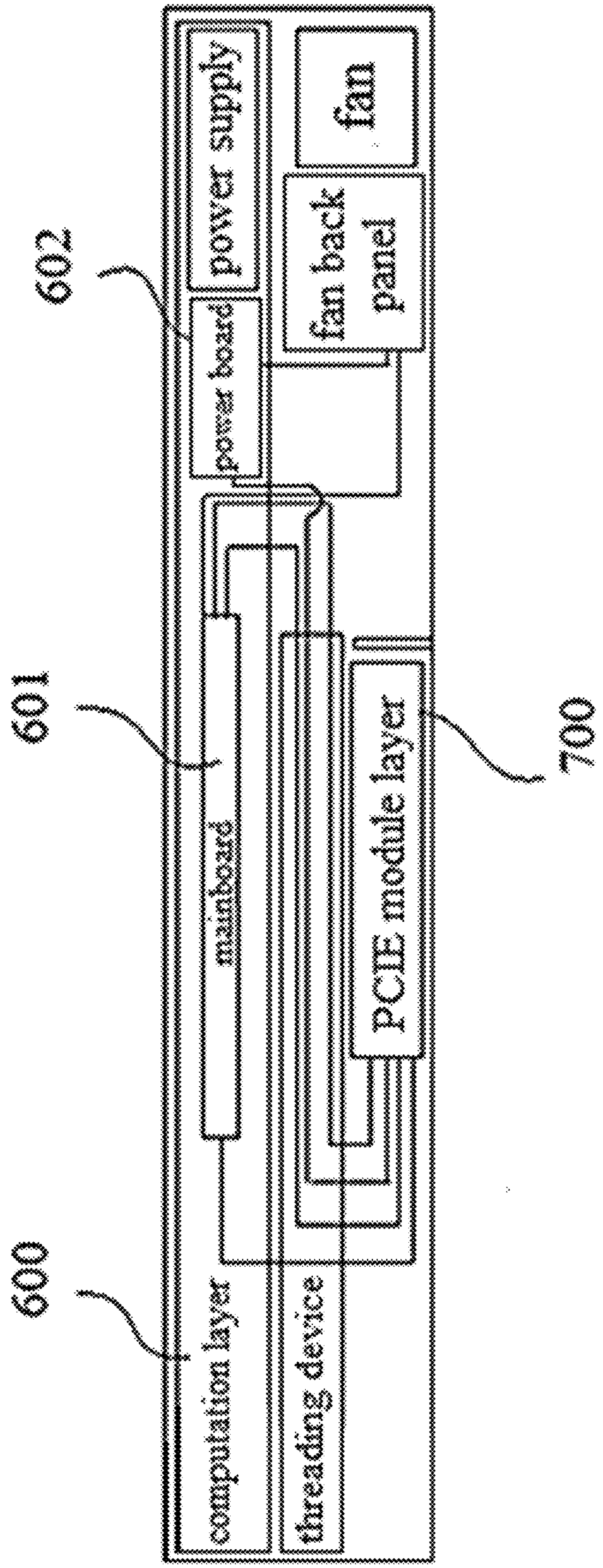
FIG. 8 is a side view of a server crate.
Figure 9:
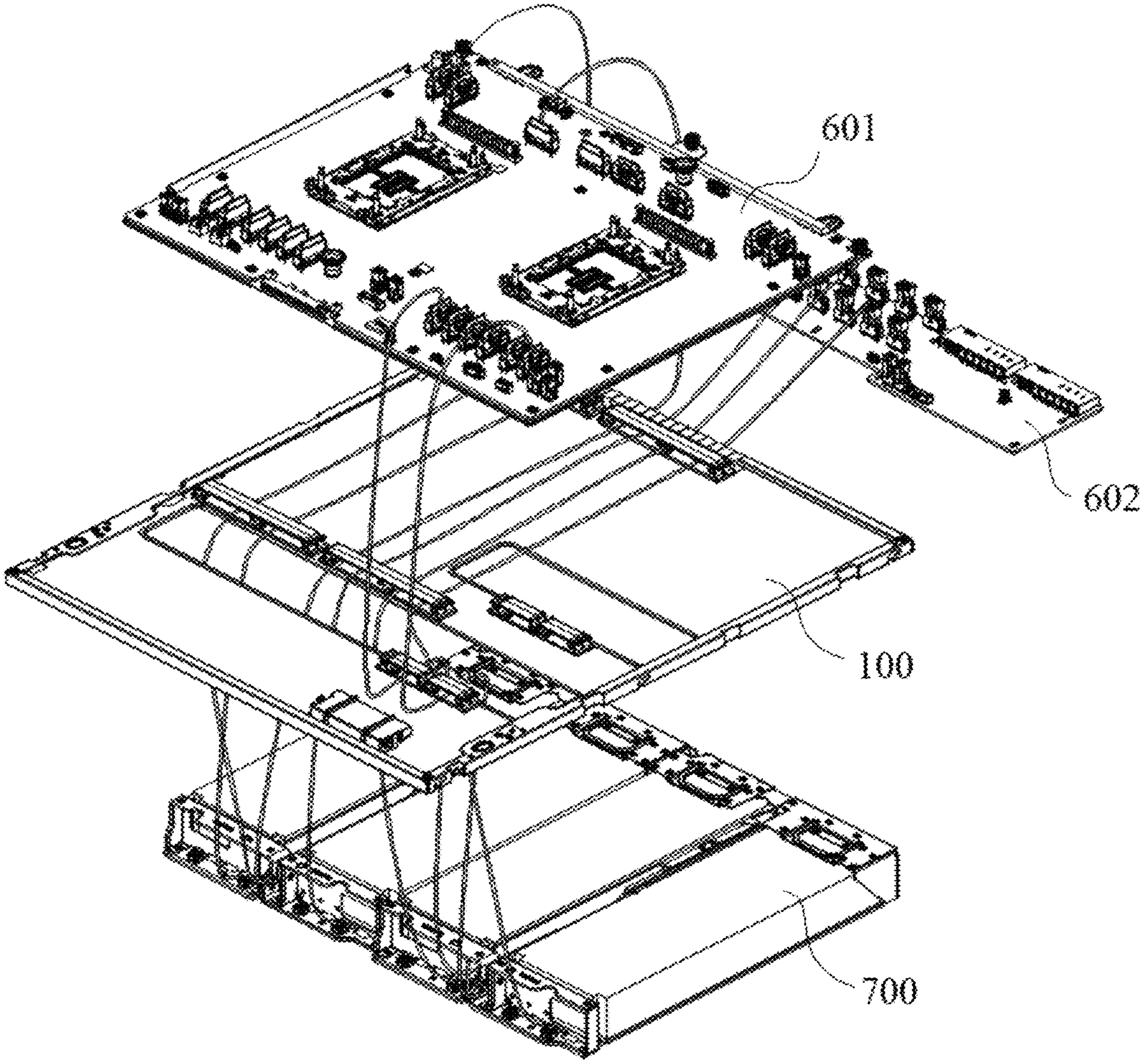
FIG. 9 is an exploded view of a computation layer, a threading device and a PCIE module layer.

As shown in FIGS. 8 and 9, an embodiment of the present application further provides a server, wherein the server comprises a server crate, a PCIE module layer 700, the threading device and a computation layer 600. All of the PCIE module layer 700, the threading device and the computation layer 700 are provided inside the server crate, and the threading device is located between the PCIE module layer 700 and the computation layer 600. A first end of the cable is connected to the PCIE module layer 700, and a second end of the cable passes through the threading device and is connected to the computation layer 600.

Particularly, the computation layer 600 is provided with the components such as a mainboard 601 and a power board 602. The PCIE module layer 700 is provided with a PCIE form card and a Riser card. In the assembling of the server, it is required to connect the PCIE form card and the power board 602 by using a cable, and connect the Riser card and the mainboard 601 by using a cable.

In the present embodiment, firstly the PCIE module layer 700 is installed into the server crate, the cables that are connected to the PCIE form card and the Riser card are caused to pass through the wiring hole, and subsequently the threading device is installed into the server crate. The cables that have passed through the wiring hole pass through the cable temporarily-storing member 200, whereby the cable temporarily-storing member 200 may clamp the cables, subsequently the computation layer is installed into the server crate, and finally the cables are connected to the power board 602 and the mainboard 601 of the computation layer 600.

The cable temporarily-storing member 200 comprises a base and a clamping mechanism. The base is provided at the tray 100, the clamping mechanism is connected to the base, the clamping mechanism is openable and closable, and the clamping mechanism is for fixing the cable that has passed through the wiring hole. Particularly, the cable connected to the PCIE module layer 700, after passing through the wiring hole, penetrates the clamping mechanism, wherein the clamping mechanism is for fixing the cable, and, subsequently, after the computation layer 600 has been installed into the server crate, the cable is connected to the computation layer 600.

As shown in FIGS. 2 and 4, in an embodiment of the present application, the connecting plate 211 is rotatably connected to the base, and the connecting plate 211 has a first position and a second position that are switchable. When the connecting plate 211 is in the first position, the connecting plate 211 and the tray 100 are perpendicular, and the cable is located inside the cable accommodating space. When the connecting plate 211 is in the second position, the connecting plate 211 and the tray 100 are parallel, and the cable is located outside the cable accommodating space.

Particularly, after the cable has passed through the wiring hole, it is required to fix the cable. The connecting plate 211 is in the first position; in other words, the connecting plate 211 is in a vertical position, and is perpendicular to the tray 100, whereby the cable that has passed through the cable accommodating space points upwardly. After the cable has been straightened, the cable is in the vertical state by using the tension of itself and the clamping force of the clamping mechanism. After the computation layer has been installed, the first snap-fitting member 213 and the first clipping slot 2121 are disengaged, to release the cable, and the cable is connected to the computation layer. Subsequently, the connecting plate 211 is flipped, to cause it to be parallel to the tray 100; in other words, the connecting plate 211 is in a horizontal position, which is the second position of the connecting plate 211.

Optionally, in an embodiment of the present application, the connecting plate 211 may be rotatably connected to the base by a rotation shaft. In another embodiment of the present application, the connecting plate 211 may also be flexibly connected to the base. Particularly, the material of the connection between the connecting plate 211 and the base may be a flexible material such as silica gel, so that the connecting plate 211 is capable of rotating relative to the base.

As shown in FIG. 2, in an embodiment of the present application, the base comprises a first bottom plate 201 and a side plate 202. The first bottom plate 201 is provided on the tray 100, the side plate 202 is perpendicular to the first bottom plate 201, and the side plate 202 is provided with a first positioning member 203. The connecting plate 211 further has a second surface opposite to the first surface, the second surface is provided with a second positioning member 214, and when the connecting plate 211 is in the first position, the second positioning member 214 abuts the first positioning member 203.

Particularly, the first positioning member 203 and the second positioning member 214 are for positioning the rotation angle of the connecting plate 211. When the connecting plate 211 has rotated to the first position from the second position, or, in other words, when the connecting plate 211 has flipped to the vertical state from the horizontal state, the second positioning member 214 exactly abuts the first positioning member 203, which may prevent the connecting plate 211 from excessively flipping, to ensure that the connecting plate 211 is perpendicular to the first bottom plate 201.

As shown in FIG. 4, in an embodiment of the present application, second clipping hooks 204 are provided at the two ends of the first bottom plate 201, and when the connecting plate 211 is in the second position, the second clipping hooks 204 are snap-fitted to the second surface of the connecting plate 211.

Particularly, slots are provided at the two ends of the second surface of the connecting plate 211, and when the connecting plate 211 is in the second position, the second clipping hooks 204 are snap-fitted to the slots, so as to cause the clamping mechanism and the base to be fixed to form an entirety.

As shown in FIG. 1, in an embodiment of the present application, the threading device further comprises a plurality of cable clamps, the cable clamps are provided at the tray 100, and the cable clamps are for fixing the cable.

Particularly, in an embodiment of the present application, the plurality of cable clamps include a plurality of first cable clamps 300 and a plurality of second cable clamps 400. The wiring hole is a plurality of wiring holes, and the plurality of wiring holes include a first wiring hole 101 and a second wiring hole 102.

Particularly, the plurality of first cable clamps 300 are arranged between the first wiring hole 101 and the cable temporarily-storing member 200, and the first cable clamps 300 and the cable temporarily-storing member 200 are for fixing the cable that has passed through the first wiring hole 101.

Particularly, the cable connected to the Riser card sequentially passes through the first wiring hole 101 and the plurality of first cable clamps 300, and subsequently penetrates the clamping mechanism of the cable temporarily-storing member 200, and the clamping mechanism fixes the cable. After the operator has straightened the cable, the cable is in the vertical state by using the tension of itself and the clamping force of the clamping mechanism. After the computation layer 600 has been installed, the first snap-fitting member 213 and the first clipping slot 2121 of the clamping mechanism are disengaged, to release the cable, the cable is connected to the computation layer 600, and subsequently the connecting plate 211 is flipped by 90°, to cause the connecting plate 211 to be parallel to the tray 100.

Optionally, in the present embodiment, between the first wiring hole 101 and the cable temporarily-storing member 200, in the direction of extension of the cable, a plurality of first cable clamps 300 may be provided to fix the direction of extension of the cable.

The second wiring hole 102 is located between the first wiring hole 101 and the cable temporarily-storing member 200, the plurality of second cable clamps 400 are located on one side of the second wiring hole 102, and the second cable clamps 400 are for fixing the cable that has passed through the second wiring hole 102.

Particularly, the cable connected to the PCIE form card passes through the second wiring hole 102, subsequently passes through the second cable clamps 400, and is connected to the power board 602 of the computation layer 600. In an embodiment, in the direction of wiring of the cable there may be a plurality of second cable clamps 400, to fix the direction of extension of the cable.

Further, in the above embodiments, both of the first wiring hole 101 and the second wiring hole 102 are rectangular holes, and have large sizes, so that a plurality of cables may pass through the first wiring hole 101 and the second wiring hole 102 at the same time. Moreover, the large sizes may facilitate the plurality of cables to be arranged side by side, which improves the aesthetic degree of the cables wiring. In the embodiment shown in FIG. 1, the length of the second wiring hole 102 is greater than the length of the first wiring hole 101. In an embodiment, the length of the second wiring hole 102 may also be equal to the length of the first wiring hole 101, or less than the length of the first wiring hole 101, as long as it is satisfied that the first wiring hole 101 and the second wiring hole are arranged in stagger, to facilitate the cable connected to the PCIE form card to be connected to the mainboard 601.

As shown in FIGS. 5 and 6, in an embodiment of the present application, the structures of the first cable clamp 300 and the second cable clamp 400 are the same. The particular structures of the first cable clamp 300 and the second cable clamp 400 will be described in detail below by taking the first cable clamp 300 as an example.

The first cable clamp 300 comprises a second bottom plate 301, a second boss 302 and a second snap-fitting member. The second bottom plate 301 is provided on the tray 100, the second boss 302 is provided at a first end of the second bottom plate 301, and the surface of the second boss 302 that is opposite to the second bottom plate 301 is provided with a second clipping slot 303. The second snap-fitting member comprises a first snap-fitting part 311, a second snap-fitting part 312 and a third clipping hook that are sequentially connected, the first snap-fitting part 311 is perpendicular to the second bottom plate 301, and is connected to a second end of the second bottom plate 301, the second snap-fitting part 312 is rotatably connected to the first snap-fitting part 311, and the third clipping hook is capable of being snap-fitted to the second clipping slot 303.

In an embodiment, the third clipping hook comprises a third snap-fitting part 313 and a fourth snap-fitting part 314. The third snap-fitting part 313 and the second snap-fitting part 312 are perpendicular and connected, the fourth snap-fitting part 314 comprises a first main body 3141 and a second main body 3142 that are connected, the included angle between the first main body 3141 and the second main body 3142 is an obtuse angle, the first main body 3141 is elastically connected to the third snap-fitting part 313, and the included angle between the first main body 3141 and the third snap-fitting part 313 is an acute angle. When the third clipping hook is snap-fitted to the second clipping slot 303, the first main body 3141 and the third snap-fitting part 313 are located inside the second clipping slot 303.

Particularly, the second snap-fitting part 312 and the first snap-fitting part 311 of the second snap-fitting member are rotatably connected, so that the second snap-fitting part 312 is capable of driving the third clipping hook to move in the direction of approaching the second clipping slot 303 or leaving the second clipping slot 303. While the third clipping hook is entering the second clipping slot 303, the included angle between the first main body 3141 of the fourth snap-fitting part 314 and the third snap-fitting part 313 is reduced, and the first main body 3141 and the third snap-fitting part 313 enter the second clipping slot 303. After they have entered, the included angle between the first main body 3141 and the third snap-fitting part 313 recovers to the original angle, so that the second main body 3142 of the fourth snap-fitting part 314 abuts the surface of the second clipping slot 303. When it is required to disengage the third clipping hook from the second clipping slot 303, the second main body 3142 is pulled, to cause the included angle between the first main body 3141 and the third snap-fitting part 313 to be reduced, whereby the first main body 3141 and the third snap-fitting part 313 are disengaged from the second clipping slot 303.

It should be noted that, in an embodiment of the present application, the particular structure of the first snap-fitting member 213 may also be the same as the particular structure of the second snap-fitting member.

In an embodiment of the present application, the end face of the tray 100 is provided with a third wiring hole, the third wiring hole and the second cable clamps 400 are located on the same one side of the second wiring hole 102, and the third wiring hole is for the penetration by the cable that has passed through the second wiring hole 102.

Particularly, in the present embodiment, the third wiring hole is provided at the end face of the tray 100, the cable connected to the PCIE form card passes through the second wiring hole 102, subsequently passes through the second cable clamps 400 and the third wiring hole, and is connected to the power board 602 of the computation layer 600.

As shown in FIG. 1, in an embodiment of the present application, the threading device further comprises a sealing member 500, and the sealing member 500 is for, after the cable has passed through the third wiring hole, sealing the third wiring hole.

Particularly, by providing the sealing member 500 at the third wiring hole, the gap between the third wiring hole and the cable may be sealed, thereby preventing the hot air inside the server crate from flowing back. Optionally, in an embodiment of the present application, the sealing member 500 may be a foam.

As shown in FIG. 7, in an embodiment of the present application, the tray 100 comprises a third bottom plate 110 and a border frame 120. The third bottom plate 110 is provided with the wiring hole and the cable temporarily-storing member 200, the border frame 120 encloses the periphery of the third bottom plate 110, a plurality of connecting slots 1201 are provided at the side face of the border frame 120 in the circumferential direction, and the connecting slots 1201 are for the snap fitting to the server crate.

Particularly, the plurality of connecting slots 1201 are provided at the periphery of the border frame 120. When the threading device is being installed into the server crate, the inner wall of the server crate is provided with a plurality of plugs, and each of the plugs is inserted into one of the connecting slots 1201, whereby the threading device is snap-fitted to the server crate, thereby realizing tool-free installation of the threading device.

Optionally, in an embodiment of the present application, each of the connecting slots 1201 comprises a first slot and a second slot that are connected, the first slot and the second slot are perpendicular, the first slot is provided in the height direction of the border frame 120, and the first slot extends throughout the bottom face of the border frame 120.

Particularly, in the installation, firstly the first slot is slid along the plug, subsequently the second slot is slid along the plug, whereby the plug is located inside the second slot, and the border frame 120 is lifted, thereby realizing tool-free installation of the threading device.

As shown in FIG. 7, in an embodiment of the present application, a plurality of elastic pieces 1202 are provided at the top face of the border frame 120 in the circumferential direction, and the elastic pieces 1202 are for abutting the computation layer 600.

Particularly, after the threading device has been installed into the server crate, the elastic pieces 1202 abut the computation layer 600, to serve to support the computation layer 600.

In the server according to the embodiments of the present application, by providing the threading device, the cable of the PCIE module layer may be caused to pass through the wiring hole, and subsequently be fixed by the cable temporarily-storing member, to enable the cable to be in the vertical state by using the tension of the cable and the clamping force of the cable temporarily-storing member. After the computation layer has been installed, the cable is released, and subsequently the cable is connected to the computation layer. The connecting process does not require simultaneous operation by multiple persons, thereby simplifying the process of the assembling of the server, increasing the efficiency of the assembling of the server, and reducing the labor cost and the time cost.

Finally, it should be noted that the above embodiments are merely intended to explain the technical solutions of the present application, and not to limit them. Although the present application is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present application.

The invention claimed is:

1. A threading device, wherein the threading device comprises: a tray, wherein the tray is for being installed inside a server crate, and located over a PCIE module layer, the tray is provided with a wiring hole, and the wiring hole is for penetration by a cable; and a cable temporarily-storing member provided at the tray, wherein the cable temporarily-storing member is for fixing the cable that has passed through the wiring hole, wherein the cable temporarily-storing member comprises: a base provided on the tray; and a clamping mechanism connected to the base, wherein the clamping mechanism is openable and closable, and the clamping mechanism is for fixing the cable that has passed through the wiring hole, wherein the clamping mechanism comprises: a connecting plate, wherein the connecting plate is connected to the base, the connecting plate has a first surface, a first end of the first surface is provided with a first boss, and the first boss is provided with a first clipping slot; and a first snap-fitting member, wherein a first end of the first snap-fitting member is rotatably connected to a second end of the first surface, a second end of the first snap-fitting member is provided with a first clipping hook, the first clipping hook is capable of being snap-fitted to the first clipping slot, and when the first clipping hook is snap-fitted to the first clipping slot, the first snap-fitting member and the connecting plate form a cable accommodating space therebetween, and wherein the connecting plate is rotatably connected to the base, and the connecting plate has a first position and a second position that are switchable; in response to the connecting plate being in the first position, the connecting plate and the tray are perpendicular, and the cable is located inside the cable accommodating space; and in response to the connecting plate being in the second position, the connecting plate and the tray are parallel, and the cable is located outside the cable accommodating space.

2. The threading device according to claim 1, wherein the base comprises a first bottom plate and a side plate, the first bottom plate is provided on the tray, the side plate is perpendicular to the first bottom plate, and the side plate is provided with a first positioning member; and the connecting plate further has a second surface opposite to the first surface, the second surface is provided with a second positioning member, and in response to the connecting plate being in the first position, the second positioning member abuts the first positioning member.

3. The threading device according to claim 2, wherein second clipping hooks are provided at two ends of the first bottom plate, and in response to the connecting plate being in the second position, the second clipping hooks are snap-fitted to the second surface of the connecting plate.

4. The threading device according to claim 3, wherein slots are provided at two ends of the second surface of the connecting plate, and in response to the connecting plate being in the second position, the second clipping hooks are snap-fitted to the slots.

5. The threading device according to claim 1, wherein the connecting plate is rotatably connected to the base by a rotation shaft.

6. The threading device according to claim 1, wherein the connecting plate is flexibly connected to the base.

7. The threading device according to claim 1, wherein the threading device further comprises a plurality of cable clamps, the cable clamps are provided at the tray, and the cable clamps are for fixing the cable.

8. The threading device according to claim 7, wherein each of the cable clamps comprises:

a second bottom plate provided on the tray;

a second boss provided at a first end of the second bottom plate, wherein a surface of the second boss that is opposite to the second bottom plate is provided with a second clipping slot; and a second snap-fitting member, wherein the second snap-fitting member comprises a first snap-fitting part, a second snap-fitting part and a third clipping hook that are sequentially connected, the first snap-fitting part is perpendicular to the second bottom plate, and is connected to a second end of the second bottom plate, the second snap-fitting part is rotatably connected to the first snap-fitting part, and the third clipping hook is capable of being snap-fitted to the second clipping slot.

9. The threading device according to claim 8, wherein the third clipping hook comprises:

a third snap-fitting part, wherein the third snap-fitting part and the second snap-fitting part are perpendicular and connected; and a fourth snap-fitting part, wherein the fourth snap-fitting part comprises a first main body and a second main body that are connected, an included angle between the first main body and the second main body is an obtuse angle, the first main body is elastically connected to the third snap-fitting part, and an included angle between the first main body and the third snap-fitting part is an acute angle; and when the third clipping hook is snap-fitted to the second clipping slot, the first main body and the third snap-fitting part are located inside the second clipping slot.

10. The threading device according to claim 7, wherein the wiring hole is a plurality of wiring holes, and the plurality of wiring holes include a first wiring hole; and the plurality of cable clamps include a plurality of first cable clamps, the plurality of first cable clamps are arranged between the first wiring hole and the cable temporarily-storing member, and the first cable clamps and the cable temporarily-storing member are for fixing the cable that has passed through the first wiring hole.

11. The threading device according to claim 10, wherein the plurality of wiring holes further include a second wiring hole, and the second wiring hole is located between the first wiring hole and the cable temporarily-storing member; and the plurality of cable clamps further include a plurality of second cable clamps, the plurality of second cable clamps are located on one side of the second wiring hole, and the second cable clamps are for fixing the cable that has passed through the second wiring hole.

12. The threading device according to claim 11, wherein an end face of the tray is provided with a third wiring hole, the third wiring hole and the second cable clamps are located on the same one side of the second wiring hole, and the third wiring hole is for penetration by the cable that has passed through the second wiring hole.

13. The threading device according to claim 12, wherein the threading device further comprises a sealing member, and the sealing member is for, after the cable has passed through the third wiring hole, sealing the third wiring hole.

14. The threading device according to claim 1, wherein the tray comprises:

a third bottom plate, wherein the third bottom plate is provided with the wiring hole and the cable temporarily-storing member; and a border frame enclosing a periphery of the third bottom plate, wherein a plurality of connecting slots are provided at a side face of the border frame in a circumferential direction, and the connecting slots are for snap fitting to the server crate.

15. The threading device according to claim 14, wherein each of the connecting slots comprises a first slot and a second slot that are connected, the first slot and the second slot are perpendicular, the first slot is provided in a height direction of the border frame, and the first slot extends throughout a bottom face of the border frame.

16. The threading device according to claim 14, wherein a plurality of elastic pieces are provided at a top face of the border frame in a circumferential direction, and the elastic pieces are for abutting a computation layer.

17. A server, wherein the server comprises:

a server crate;

a PCIE module layer provided inside the server crate;

the threading device according to claim 1, provided inside the server crate, and located over the PCIE module layer; and a computation layer, provided inside the server crate, and located over the threading device; and a first end of the cable is connected to the PCIE module layer, and a second end of the cable extends throughout the threading device and is connected to the computation layer.

* * * * *